United States Patent
Zhan et al.

(10) Patent No.: US 10,816,597 B2
(45) Date of Patent: Oct. 27, 2020

(54) SINGLE PIN TEST INTERFACE FOR PIN LIMITED SYSTEMS

(71) Applicant: Silicon Laboratories Inc., Austin, TX (US)

(72) Inventors: Huanhui Zhan, Austin, TX (US); Krishna Pentakota, Austin, TX (US); Stefan N. Mastovich, Round Rock, TX (US)

(73) Assignee: Silicon Laboratories Inc., Austin, TX (US)

( * ) Notice: Subject to any disclaimer, the term of this patent is extended or adjusted under 35 U.S.C. 154(b) by 251 days.

(21) Appl. No.: 15/836,363

(22) Filed: Dec. 8, 2017

(65) Prior Publication Data

US 2019/0178937 A1 Jun. 13, 2019

(51) Int. Cl.
*G01R 31/317* (2006.01)
*G01R 31/316* (2006.01)

(52) U.S. Cl.
CPC ..... *G01R 31/31713* (2013.01); *G01R 31/316* (2013.01); *G01R 31/3172* (2013.01); *G01R 31/31702* (2013.01); *G01R 31/31722* (2013.01)

(58) Field of Classification Search
CPC ............ G01R 31/31713; G01R 31/316; G01R 31/3172; G01R 31/31722; G01R 31/31702
See application file for complete search history.

(56) References Cited

U.S. PATENT DOCUMENTS

| | | | |
|---|---|---|---|
| 4,689,740 A | 8/1987 | Moelands et al. | |
| 5,301,023 A | 4/1994 | Zato | |
| 5,398,326 A | 3/1995 | Lee | |
| 5,451,912 A | 9/1995 | Torode | |
| 5,687,121 A * | 11/1997 | Lee .......................... | G11C 8/10 365/185.11 |
| 5,818,814 A | 10/1998 | Testani | |
| 5,822,373 A | 10/1998 | Addy | |
| 5,841,717 A | 11/1998 | Yamaguchi | |
| 5,864,872 A | 1/1999 | Lee et al. | |
| 7,036,031 B2 | 4/2006 | Takeuchi | |
| 7,562,275 B2 | 7/2009 | Juhn | |
| 8,502,584 B1 | 8/2013 | Dong et al. | |
| 8,934,528 B2 | 1/2015 | Sonntag | |
| 9,118,392 B2 | 8/2015 | Sundar et al. | |
| 9,143,373 B2 | 9/2015 | Sonntag et al. | |

(Continued)

FOREIGN PATENT DOCUMENTS

WO WO96/036953 11/1996

*Primary Examiner* — Akm Zakaria
(74) *Attorney, Agent, or Firm* — Zagorin Cave LLP

(57) ABSTRACT

An integrated circuit includes a supply terminal to receive a supply voltage and a test terminal that operates in an input mode and an output mode. A test interface of the integrated circuit operates in a normal mode requiring a serial write to the test terminal to access test locations in the integrated circuit. The test interface also operates in an automatic mode in which addresses for test locations are auto incremented by toggling the supply voltage from a high voltage level to a low voltage level and back to the high voltage level. In an input mode, with the supply voltage at the low voltage level, the test pin receives configuration and address information. In output mode, with the supply voltage at the high voltage level, the test pin supplies test information corresponding to the address information received.

21 Claims, 4 Drawing Sheets

(56) References Cited

U.S. PATENT DOCUMENTS

| | | |
|---|---|---|
| 9,257,836 B2 | 2/2016 | Mills et al. |
| 9,531,253 B2 | 12/2016 | Wahby et al. |
| 9,531,376 B2 | 12/2016 | Sonntag et al. |
| 9,645,621 B2 | 5/2017 | Frederickson et al. |
| 9,923,643 B2 | 3/2018 | Dupuis et al. |
| 10,488,456 B2 | 11/2019 | Stroud et al. |
| 2001/0015924 A1* | 8/2001 | Arimoto ............ G01R 31/3172 365/201 |
| 2005/0030156 A1 | 2/2005 | Alfonso |
| 2006/0164061 A1 | 7/2006 | Formenti et al. |
| 2008/0031167 A1 | 2/2008 | Chen |
| 2008/0209250 A1 | 8/2008 | Fong |
| 2009/0013164 A1 | 1/2009 | Huang et al. |
| 2009/0213914 A1 | 8/2009 | Dong |
| 2010/0082956 A1 | 4/2010 | Cheng et al. |
| 2010/0142295 A1 | 6/2010 | Seo |
| 2010/0202626 A1 | 8/2010 | Shiori |
| 2010/0249886 A1 | 9/2010 | Park et al. |
| 2011/0188292 A1 | 8/2011 | Joo |
| 2012/0149303 A1 | 6/2012 | Moes et al. |
| 2012/0250746 A1 | 10/2012 | Sonntag |
| 2012/0303979 A1 | 11/2012 | Hung et al. |
| 2013/0007484 A1 | 1/2013 | Gobriel |
| 2013/0124121 A1 | 5/2013 | Hariharasudhan |
| 2015/0002199 A1 | 1/2015 | Hyun |
| 2015/0262649 A1* | 9/2015 | Jeon ........................ G11C 8/18 365/191 |
| 2018/0076909 A1 | 3/2018 | Latham |

\* cited by examiner

SINGLE PIN TEST INTERFACE FOR PIN LIMITED SYSTEMS

BACKGROUND

Field of the Disclosure

The disclosure herein relates to test interfaces and ways to reduce test time in certain test environments.

Description of the Related Art

For a pin limited or cost limited chip package, a one pin test interface is preferred. However, providing only one pin (also referred to herein as terminal) requires that the one pin be used for both test input and test output making the control needed to switch transmit directions complicated. That is, during testing, the direction of the serial communication channel changes from input to output and vice versa in order to send test control information to the integrated circuit and receive test results from the integrated circuit. Switching direction on the serial communication channel can take significant time, especially during production test, making testing take longer and driving up the cost.

Accordingly, it would be desirable to provide testing improvements that can help reduce testing time.

SUMMARY OF EMBODIMENTS OF THE INVENTION

Accordingly, in one embodiment, a method includes configuring an integrated circuit into an automatic mode using a first terminal, e.g., a test terminal, of the integrated circuit. The method includes sending first address information to the first terminal with a supply voltage at a first voltage level, the address information identifying a first test location in the integrated circuit. First test information corresponding to the first test location is supplied over the first terminal with the supply voltage at a second voltage level. The supply voltage is toggled by changing the supply voltage from the second voltage level to the first voltage level and back to the second voltage level. The first address information is modified responsive to the toggling to generate modified address information identifying a second test location in the integrated circuit. Second test information corresponding to the second test location is supplied from the first terminal with the supply voltage at the second voltage level.

In another embodiment an integrated circuit includes a first terminal and includes a second terminal to receive a supply voltage. A storage location stores first address information received over the first terminal identifying a first test location in the integrated circuit. The first terminal, e.g., a test terminal, supplies first test information from the first test location responsive to the first address information identifying the first test location and the supply voltage being at a first voltage level. A clock generation circuit supplies a clock signal responsive to toggling of the supply voltage from the first voltage level to a second voltage level that is below the first voltage level and back to the first voltage level. A circuit modifies, e.g., increments, the first address information responsive to the clock signal to generate second address information identifying a second test location and the first terminal is coupled to supply second test information from the second test location responsive to the second address and to the supply voltage being at the first voltage level.

In another embodiment a method includes configuring an integrated circuit into an automatic mode for test operation. First test information corresponding to a first test location identified by address information stored in the integrated circuit is supplied over a terminal of the integrated circuit. The address information is modified responsive to toggling of the supply voltage from a first voltage level above a threshold voltage level to a second voltage level below the threshold voltage level and back to the first voltage level, to thereby generate modified address information. Second test information corresponding to a second test location identified by the modified address information is supplied over the terminal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
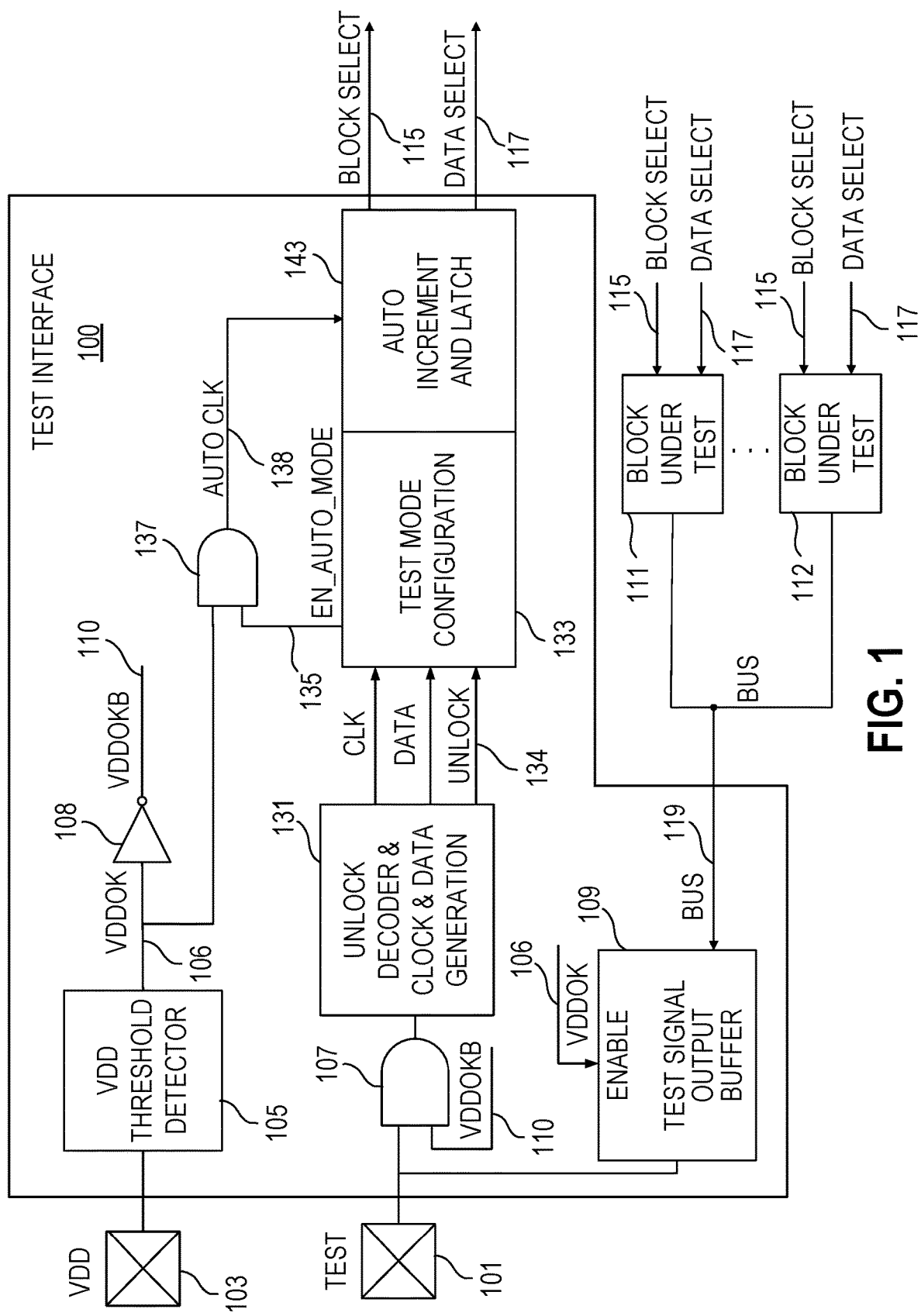
FIG. 1 illustrates a test interface of an integrated circuit according to an embodiment.

Referring to FIG. 1, a test interface 100 of an integrated circuit utilizes a single test terminal 101 to receive and transmit test related information. In a test environment the integrated circuit may be packaged and the term "terminal" refers to a pin or other electrical connection on the package. The term terminal can also refer to the part of the die that couples to a package pin in a die or wafer test environment. In addition to the test terminal 101, the illustrated embodiment utilizes the supply voltage terminal 103 to receive the voltage supply (VDD) and to convey a digital signal to the test interface of the integrated circuit. That allows additional test functionality to be gained without having to physically provide another terminal.

The test terminal 101 receives information to, e.g., establish a normal mode or automatic mode of operation, which are described further herein, and to supply address information that identifies a location in the integrated circuit that is a test location. The test terminal may also be used to receive data to configure the integrated circuit or the test interface of the integrated circuit. The test location identified by the address information may relate to digital or analog data. For example, the address information may specify a register to be read from or written to in order configure the integrated circuit. The address information may specify an analog location to be "probed." In either case, the test terminal 101 receives the test information related to the test location.

Figure 2:
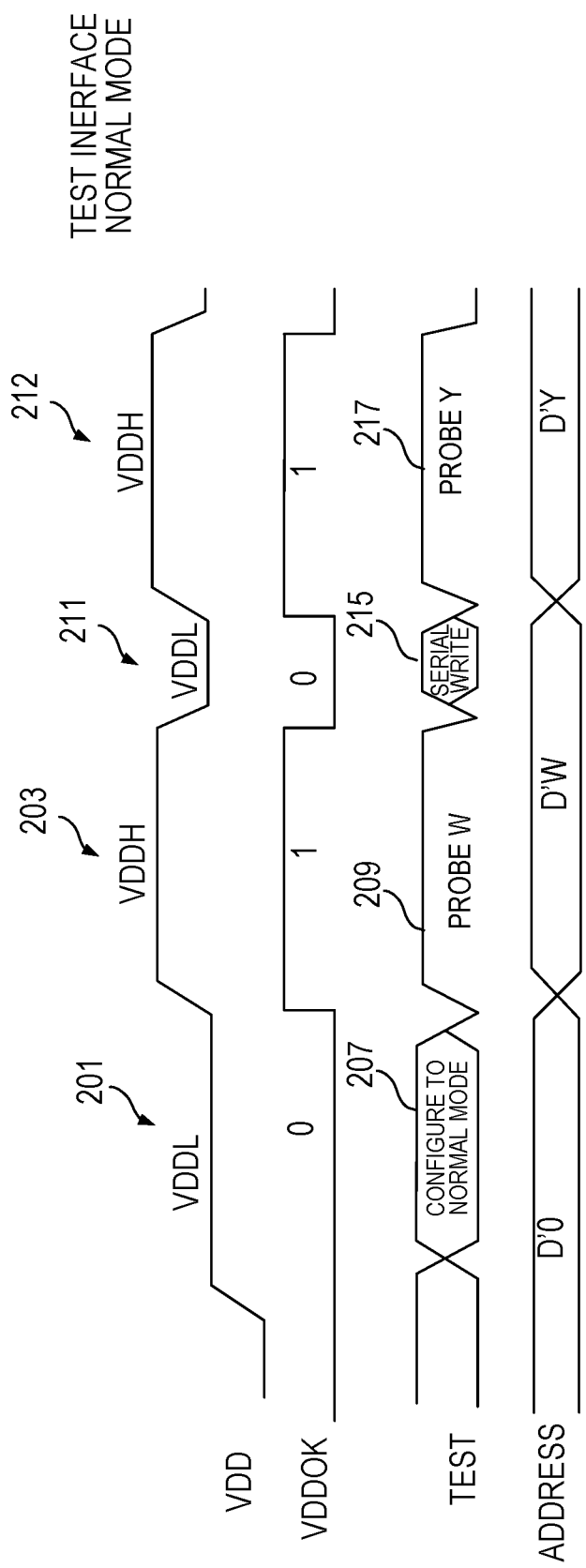
FIG. 2 is a timing diagram illustrating operation of the test interface in normal mode.

Referring to FIG. 2, a timing diagram illustrates one aspect of operation of the test interface 100. The voltage supply VDD can take on a high voltage value (VDDH) and a low voltage value (VDDL). VDDL needs to be at a voltage level sufficient to operate the test interface block 100, but in at least some embodiments does not need to operate those portions the integrated circuit that are unrelated with test configuration. In addition, VDD can take on a zero voltage value when power is off. FIG. 2 shows that at 201 the voltage supply is VDDL and at 203, the voltage supply is at VDDH. By way of example, VDDL may be 1.8 V and VDDH may be 2.5 V. Different integrated circuits can have different voltage ranges that are sufficient to operate the integrated circuit. Referring to FIGS. 1 and 2, with the supply voltage at VDDL, the VDD threshold detector 105 detects the VDDL voltage level and sets the VDDOK signal 106 to be a logic low. Inverter 108 supplies the VDDOKB signal 110 with the opposite polarity. With VDD at VDDL, the test terminal 101 functions as an input terminal. With VDD at the VDDH level, AND gate 107 blocks any input from the terminal since the VDDOKB signal 110 is a logic low. With VDD at the VDDH level the VDDOK signal enables the test signal output buffer 109, which drives the test terminal 101 with test information from the integrated circuit. As described above, that may be analog or digital data.

During the time period 201 with VDD at VDDL, the test terminal 101 receives mode configuration information. Prior to receiving the configuration information, in certain embodiments the test interface receives an unlock command, e.g., a unique string of data bits to unlock the test interface. After unlocking the test interface, the information received by the test terminal 101 includes a mode field that specifies the mode of operation. The mode field can be a single bit or multiple bits if more than two modes of operation are possible for the test interface. In the operation illustrated in FIG. 2, the mode field specified a normal mode of operation. In addition to configuring the test interface in normal mode in 207, the test interface receives address information that specifies the test location in the integrated circuit to be "probed" and supplied as test information on test terminal 101. For example, the address information may include 16 bits with 8 (or fewer) bits being block select bits specifying a block, e.g., block 111 within the integrated circuit and 8 bits (or fewer) specifying a node to be probed within that block. In addition, the address information may be divided into address bits and data bits for writing data to a particular location in the integrated circuit. As stated earlier, the location being probed may be an analog signal or digital data.

In the timing diagram of FIG. 2, assume the address information received by the test terminal with VDD at VDDL during 201 was address "W". When VDD switches to VDDH during 203, the test signal output buffer 109 drives the test information from test location W in the block under test on signal line 119 to test terminal 101 operating in output mode. The test information may be, e.g., a voltage from one of multiple selectable nodes within block 111. Application Ser. No. 15/609,996, entitled TEST INTERFACE WITH ACCESS ACROSS ISOLATION BARRIER, filed May 31, 2017, which is incorporated herein by reference, describes how analog and digital test locations (probe points) may be selected. FIG. 2 shows the address bits, supplied as block select bits 115 and data select bits 117 from the test interface 100 to identify the desired test location.

In order to probe another test location ("Y") in normal mode, the external test interface (not shown) has to reduce the supply voltage to VDDL at 211 and serially write address information that identifies Y at 215. Address Y may, e.g., identify a test location in block 112. Turning the bus around from receive to transmit and then back to receive takes time at the external test interface supplying the address information and receiving the test information. In addition, writing the additional address information Y also takes time. After the serial write at 215 and after VDD goes to VDDH at 212, the test terminal 101 supplies the test information from test location Y at 217. In a debug or verification test environment, the delay to obtain test information from the next probe point may be acceptable. However, in a production test environment, the longer the test time for an integrated circuit, the lower the throughput and the higher the cost.

Figure 3:
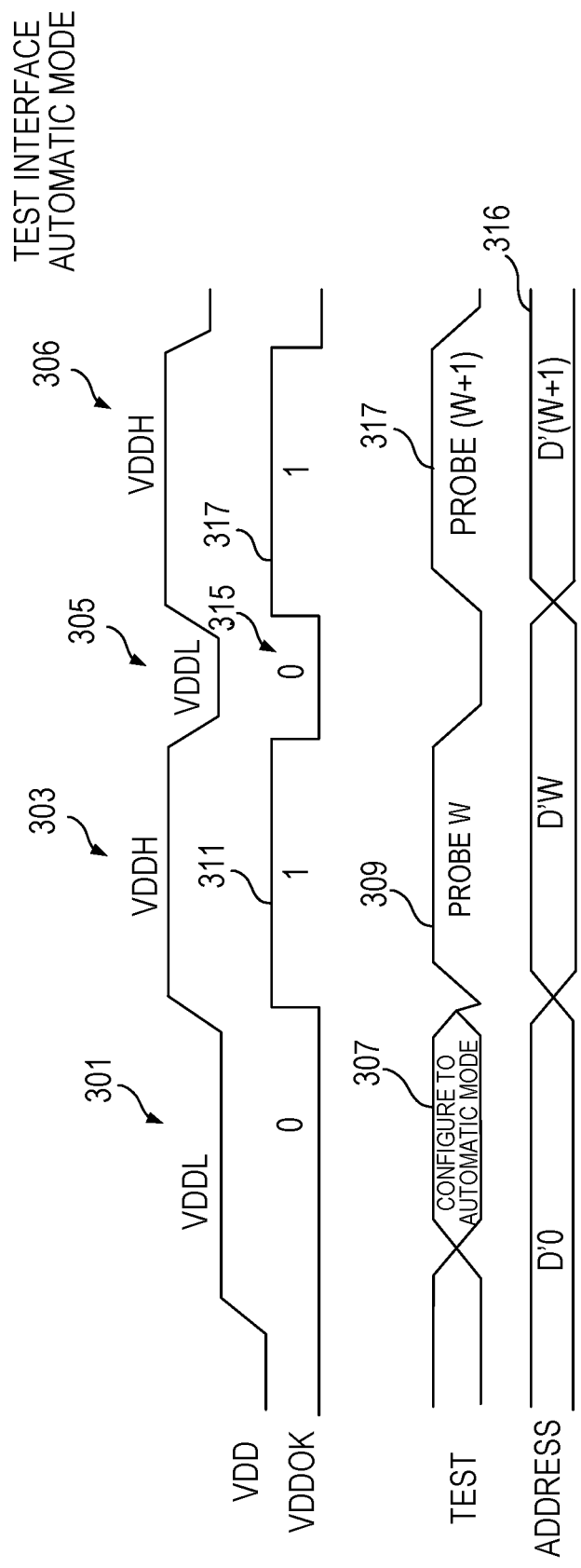
FIG. 3 is a timing diagram illustrating operation of the test interface in automatic mode.

Accordingly, in addition to the normal mode illustrated in FIG. 2, embodiments described herein also support an automatic mode in which the address information is automatically changed (e.g., incremented or decremented) by toggling the supply voltage VDD from VDDH to VDDL to VDDH. FIG. 3 illustrates operation in automatic mode. Starting at 301 with VDD at VDDL, the test terminal 101 is in input mode and receives configuration information during 307 to configure the test interface to automatic mode. The configuration information may be, e.g., the two most significant bits (MSBs) of the address. In an embodiment, the two MSBs being set to 11 indicates automatic mode and the remaining values 00, 01, 11 indicate normal mode. Of course, many other approaches can be used to encode the configuration information. Once in automatic mode, the test terminal receives address information. That address information may be included with the configuration information or may be sent in a separate serial transaction with VDD at VDDL. Note that with VDD at VDDL, the test interface supplies block and data select bits with a value of 0 (D'0). Responsive to VDD switching to VDDH, the test output signal buffer 109 drives test information for test location W to the test terminal at 309 as indicated by PROBE W in FIG. 3.

Instead of having to perform another serial write, the automatic mode allows the address information to be modified (e.g., incremented or decremented) by toggling VDD. While driving the test information from test location W, VDD was at VDDH at 303. Toggling VDD to VDDL at 305 and then to VDDH at 306 causes the address information to change to (W+1) at 316 resulting in the test output signal buffer 109 driving test information for test location (W+1) to the test terminal at 317. Thus, the VDD signal acts as a clock signal. The test terminal direction never has to be turned around from output mode to input mode and back. The test equipment receiving the test information also can remain in a receive mode without having to initiate another serial write. The serial operation shown at 215 in FIG. 2 can be omitted. By continuing to toggle the supply voltage, the test interface can sweep through test locations by incrementing (or decrementing) the current address information. In this mode, all tests locations can be swept by toggling VDD between VDDL and VDDH.

Referring back to FIG. 1, the high level blocks used to cause operation in automatic mode are described in more detail. A logic block 131 decodes a received serial string and unlocks the test interface when the correct serial string is received. In addition, in an embodiment, the logic block 131 also recovers the clock from the data and provides both data and clock to test mode and configuration block 133 along with an unlock signal 134 indicating the test interface has been unlocked. In an embodiment, the serial interface operates using pulse width modulation to encode the digital data but many other serial communication protocols are well known in the art and can be used in embodiments to supply the configuration and address information described herein.

The test mode configuration block 133 decodes received information to determine whether to operate in normal mode or automatic mode. The test mode configuration block also receives address information from block 131 and supplies the address information to the auto increment and latch block 143 described further herein.

Figure 4:
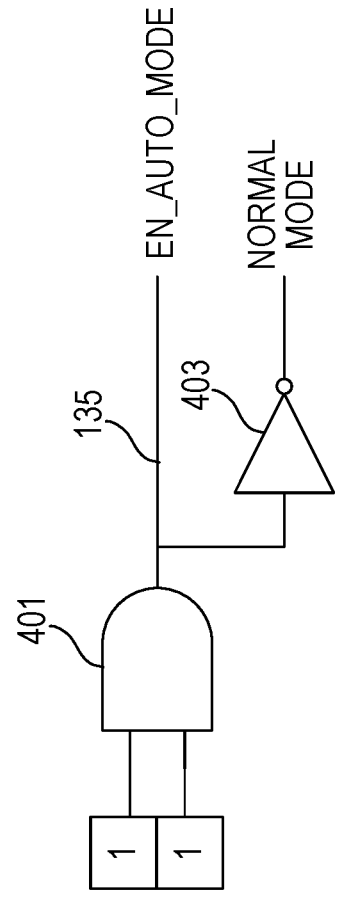
FIG. 4 illustrates an example of an embodiment of mode decode logic.

Referring to FIG. 4, the mode decoder logic in block 133 in an embodiment includes AND gate 401 and inverter 403, assuming two bits of the address information determine the mode and a binary "11" sets automatic mode. Of course, additional decoding may be required for other aspects of the address information received.

Once automatic mode is enabled, the test mode configuration block 133 supplies an asserted enable automatic mode signal 135 to AND gate 137. When VDD toggles, VDDOK starts at a logic high in 311, goes to 0 in 315 and goes back high in 317. VDD threshold detector 105 supplies AND gate 137 with VDDOK 106. When VDDOK rises back to a logic high, that causes a rising edge on the clock signal 138 that causes an arithmetic circuit to increment (or decrement) the address information.

Figure 5:
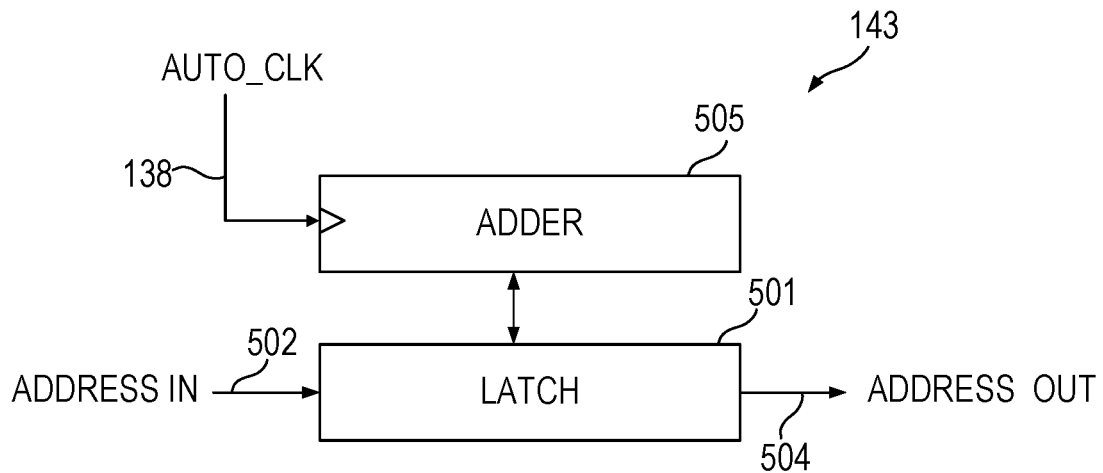
FIG. 5 illustrates a high level functional block diagram of an auto increment and latch block according to an embodiment.

FIG. 5 illustrates a high level functional block diagram of auto increment and latch block 143. Block 143 includes a latch or register 501 that stores address information 502 received from the test mode configuration block 133 when a load signal (not shown) is asserted and supplies address information 504 to the integrated circuit, e.g., as block select 115 and data select 117. The auto increment and latch block 143 also includes an adder circuit 505 that is loaded from latch 501 when latch 501 is loaded. In automatic mode, the adder circuit increments (or decrements) by one (or other predetermined amount). For ease of discussion assume adder 505 is a one bit incrementer. After incrementing, the incremented value is loaded into latch 501 and is supplied from latch 501 as address 504 to select the next test location to probe, e.g., in the form of block select and data select lines. Note that the latch and increment functionality may be combined.

Figure 6:
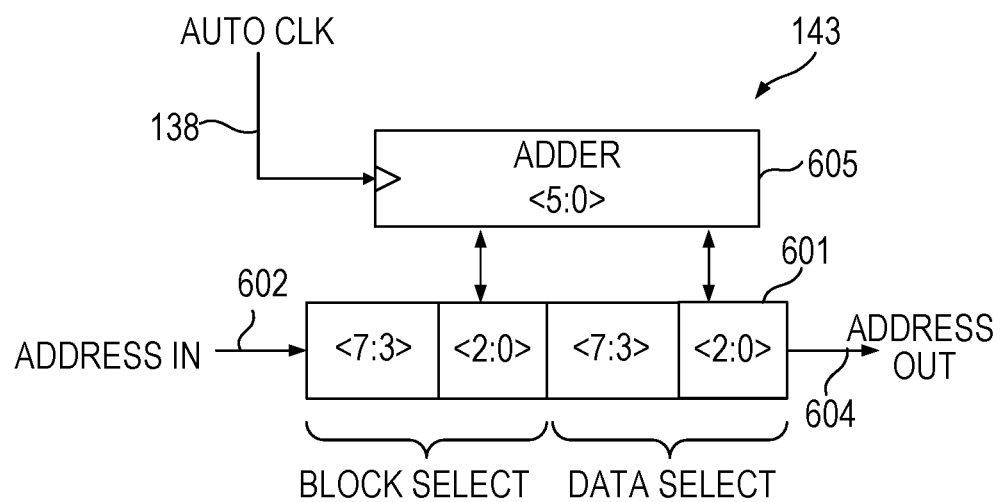
FIG. 6 illustrates a high level functional block diagram of another embodiment of an auto increment and latch block.

In an exemplary embodiment, the block select portion of the address information is 8 bits and the data select portion is also 8 bits. However, in an embodiment, only a portion of the block select portion and the data select portion are auto incremented. Referring to FIG. 6, latch 601 receives address information 602 and supplies address information 604 to select a test location. Three bits [2:0] of block select and three bits [2:0] of data select are subject to auto increment in automatic mode. Bits [7:3] of block select and bits [7:3] of data select are unaffected by automatic mode and can only be changed to a non-zero value using a serial write. During auto increment mode the data select bits [2:0] will increment from 0 (000) to 7 (111). On the next increment clock, data select bits [2:0] in adder 605 roll over to zero and block selects bits [2:0] in adder 605 increment by one. In other words, the LSBs of block select and data select act like a contiguous field even though there are additional bits in the block select and data select bits in latch 601 not subject to auto incrementing. While incrementing has been described other embodiments may start the address information at a particular value specified by a serial write and decrement the address information.

While toggling the supply voltage, the increment block can advance through the addresses. However, it may be desirable to change all or part of the address information in automatic mode. For example, it may be desirable to change the high order bits of block select and/or data select. Thus, referring back to FIG. 3, when VDD is brought down to VDDL at 305, the time period spent in 305 can be extended and a serial write similar to 215 can be performed to change the address information that is being incremented. Once the serial transfer completes and VDD is brought high to VDDH, an auto-increment occurs before the next test information is provided. For example, if the serial write writes address information R, the probe returns test location (R+1) due to the automatic mode increment.

The auto increment and latch block can utilize any increment or decrement value useful for the embodiment. In other embodiments a different sort of arithmetic circuit may be used to modify the address information. While the address information has been described in one embodiment as containing block select and data select information, in other embodiments the address information is not broken down in block select and data select.

Thus, various aspects have been described relating to improved test access to an integrated circuit particularly useful during production testing. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
configuring an integrated circuit into an automatic mode using a first terminal of the integrated circuit;
sending first address information to the first terminal with a supply voltage at a first voltage level, the first address information identifying a first test location in the integrated circuit;
supplying first test information corresponding to the first test location over the first terminal with the supply voltage at a second voltage level;
toggling the supply voltage by changing the supply voltage from the second voltage level to the first voltage level and back to the second voltage level;
modifying the first address information responsive to the toggling to generate modified address information identifying a second test location in the integrated circuit; and
supplying second test information corresponding to the second test location from the first terminal with the supply voltage at the second voltage level.

2. The method as recited in claim 1 further comprising:
generating a clock signal from the toggling of the supply voltage; and
modifying the first address information responsive to the clock signal.

3. The method as recited in claim 1, wherein the modifying of the first address information comprises incrementing or decrementing the first address information.

4. The method as recited in claim 1, wherein the first voltage level is lower than the second voltage level.

5. The method as recited in claim 1, wherein only a first portion of first address information is changeable responsive to the toggling.

6. The method as recited in claim 1, further comprising:
writing second address information while remaining in the automatic mode; and
modifying the second address information responsive to further toggling of the supply voltage while in the automatic mode.

7. The method as recited in claim 1, further comprising:
configuring the first terminal as an input terminal responsive to the supply voltage being at the first voltage level and as an output terminal responsive to the supply voltage being at the second voltage level.

8. An integrated circuit comprising:
a first terminal;
a second terminal to receive a supply voltage;
a storage location to store first address information identifying a first test location in the integrated circuit, the first address information received over the first terminal;
wherein the first terminal is coupled to supply first test information from the first test location responsive to the first address information identifying the first test location and the supply voltage being at a first voltage level;
a clock generation circuit to supply a clock signal responsive to toggling of the supply voltage from the first voltage level to a second voltage level that is below the first voltage level and back to the first voltage level;
a circuit to modify the first address information responsive to the clock signal to generate second address information identifying a second test location; and
wherein the first terminal is coupled to supply second test information from the second test location responsive to the second address information and the supply voltage being at the first voltage level.

9. The integrated circuit as recited in claim 8 further comprising:
a decoder circuit to assert an automatic mode of operation signal responsive to receiving mode control information from the first terminal;
a threshold voltage detector circuit to detect when the supply voltage is above a threshold voltage level thereby indicating the first voltage level and to detect when the supply voltage is below the threshold voltage level thereby indicating the second voltage level; and
wherein the clock generation circuit is configured to assert a rising edge of the clock signal responsive to the automatic mode of operation signal being asserted and responsive to the threshold voltage detector circuit detecting the supply voltage has transitioned from the second voltage level to the first voltage level.

10. The integrated circuit as recited in claim 8, wherein the circuit to modify increments or decrements the first address information responsive to the clock signal.

11. The integrated circuit as recited in claim 8, wherein only a first portion of the first address information is configured to change responsive to the toggling.

12. The integrated circuit as recited in claim 8 wherein the first terminal is configured to be in an input mode responsive to the supply voltage being at the second voltage level and to be in an output mode responsive to the supply voltage being at the first voltage level.

13. The integrated circuit as recited in claim 8 further comprising:
a decoder circuit to assert an automatic mode of operation signal responsive to receiving first mode information from the first terminal and to de-assert the automatic mode of operation signal responsive to receiving second mode information from the first terminal.

14. A method comprising:
configuring an integrated circuit into an automatic mode for test operation;
supplying first test information over a terminal of the integrated circuit, the first test information corresponding to a first test location identified by address information stored in the integrated circuit;
modifying the address information responsive to toggling of a supply voltage from a first voltage level above a threshold voltage level to a second voltage level below the threshold voltage level and back to the first voltage level, to thereby generate modified address information; and
supplying second test information corresponding to a second test location identified by the modified address information over the terminal of the integrated circuit.

15. The method as recited in claim 14 comprising:
modifying the address information by incrementing the address information.

16. The method as recited in claim 14 comprising:
configuring the integrated circuit to operate in the automatic mode responsive to mode information received over the terminal of the integrated circuit with the supply voltage at the second voltage level.

17. The method as recited in claim 16 supplying the first test information over the terminal with the supply voltage at the first voltage level and supplying the second test information over the terminal with the supply voltage at the first voltage level.

18. The method as recited in claim 17 further comprising configuring the terminal to be in an input mode responsive to the supply voltage being at the first voltage level and to be in an output mode responsive to the supply voltage being at the second voltage level.

19. The method as recited in claim 14 comprising:
modifying the modified address information responsive to further toggling of the supply voltage and supplying further modified address information; and
supplying third test information corresponding to a third test location identified by the further modified address information, the third test information being supplied with the supply voltage at the first voltage level.

20. The method as recited in claim 14 comprising:
receiving the address information over the terminal with the supply voltage at the second voltage level.

21. The integrated circuit as recited in claim 8 further comprising:
a test interface block operable using the supply voltage, the test interface block including the clock generation circuit and the circuit to modify; and
wherein the test interface block is operable with the supply voltage at the first voltage level and with the supply voltage at the second voltage level.

* * * * *